Figure 1:
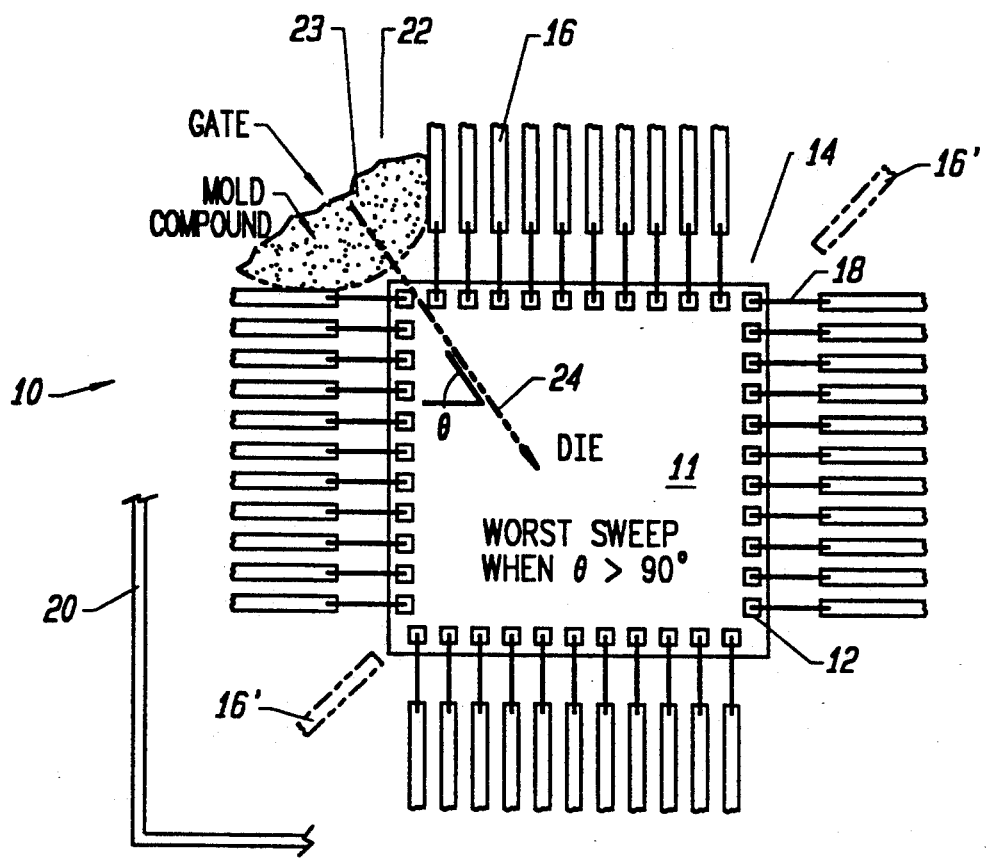

United States Patent [19]
Nguyen et al.

[11] Patent Number: 5,296,743
[45] Date of Patent: Mar. 22, 1994

[54] PLASTIC ENCAPSULATED INTEGRATED CIRCUIT PACKAGE AND METHOD OF MANUFACTURING THE SAME

[75] Inventors: Luu T. Nguyen, San Jose; Hem P. Takiar, Fremont, both of Calif.

[73] Assignee: National Semiconductor Corporation, Santa Clara, Calif.

[21] Appl. No.: 58,424

[22] Filed: May 7, 1993

[51] Int. Cl.$^5$ .................... H01L 29/48; H01L 29/44; H01L 29/52; H01L 29/60

[52] U.S. Cl. .................... 257/784; 257/667; 257/666

[58] Field of Search .............. 257/666, 669, 667, 787, 257/784

[56] References Cited
U.S. PATENT DOCUMENTS 5,126,823  6/1992  Otsuka et al. .................... 257/666
5,155,578 10/1992  Lim et al. .................... 257/784

*Primary Examiner*—Sheila V. Clark
*Attorney, Agent, or Firm*—Ware & Freidenrich

[57] ABSTRACT

A method of making an integrated circuit package is disclosed herein along with the package itself, which package is encapsulated by plastic that is caused to flow in a given direction during the package's formation. The package itself includes an IC chip having an array of chip output/input terminals, and means for supporting the chip including an array of electrically conductive leads, all of which are provided for connection with the output/input terminals of the IC chip. In addition, the overall package includes bonding wires connecting the chip output/input terminals with respective ones of the leads such that each bonding wire extends in a direction that defines an acute angle of less than 45 degrees with the given flow direction of the plastic material used to encapsulate the IC chip, support means and bonding wires. In a preferred embodiment, at least a portion and most preferably substantially all of the bonding wires are substantially parallel with the given flow direction of the plastic material.

15 Claims, 2 Drawing Sheets

PLASTIC ENCAPSULATED INTEGRATED CIRCUIT PACKAGE AND METHOD OF MANUFACTURING THE SAME

The present invention relates generally to integrated circuit packages, and more particularly to a specific method of making a particular plastic encapsulated integrated circuit package and the package itself.

A typical plastic encapsulated integrated circuit package is comprised of (1) an IC chip including an array of chip output/input terminals, (2) means for supporting the chip, for example, either a lead frame or substrate, including an array of electrically conductive leads, all of which are provided for connection with the output/input terminals of the IC chip, (3) bonding wires connecting the chip output/input terminals with respective ones of the leads, and (4) plastic material encapsulating the IC chip, support means and bonding wires. This overall integrated circuit package is typically manufactured by initially supporting the IC chip on its support means as a unit with the bonding wires connecting the chip's output/input terminals with respective ones of the leads forming part of the support means. Thereafter, this unit is placed in a cooperating mold and plastic material is caused to flow into the mold through a cooperating gate and in a given flow direction so as to encapsulate the IC chip, support means and bonding wires.

Current lead frames and substrates are designed, usually initially so with the aid of CAD tools, either in a radial or non-radial but typically symmetrical pattern to maximize the number of I/Os that can possibly be incorporated into the overall plastic encapsulated integrated circuit package. The radial pattern uses the center of the chip or die as it is commonly called to lay out the lead fingers, resulting in bond pads that typically are not uniformly separated and wire bonds of different lengths. In the non-radial pattern design, on the other hand, bond pads are placed equidistant from one another, to yield a lead finger fanout with uniform pitch, but rather steep angles at the stitch bonds. The nature of both types of designs is such that the angles of the bonding wires with respect to the melt front of the flowing plastic jetting into the mold from its cooperating gate can be detrimental to wire sweep, that is, it can subject the bonding wires to undesirable drag forces, thereby disconnecting or otherwise damaging them. This is best illustrated in FIGS. 1 and 2 which will be discussed immediately below.

Figure 2:
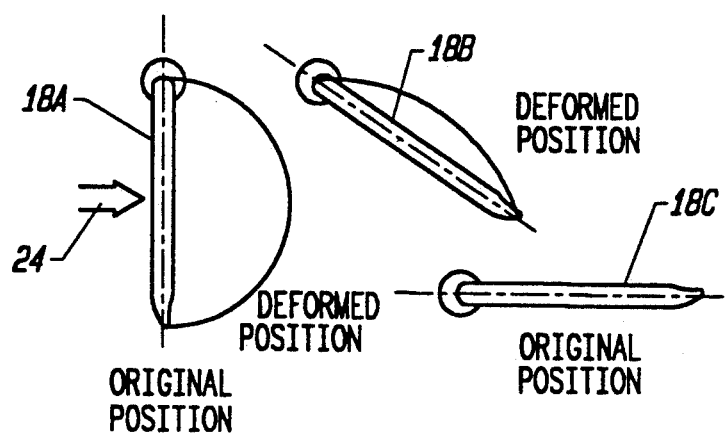

FIG. 1 diagrammatically illustrates an intermediate step in the formation of a plastic encapsulated integrated circuit package which is generally indicated at 10. This package, as seen in FIG. 1, includes a die (IC chip) 11 including an array of chip output/input terminals or pads 12. This chip is supported on a suitable support member 14 which can be, for example, a standard lead frame or a dielectric substrate. The support member includes an array of electrically conductive leads 16, all of which are provided for connection with the output/input terminals of IC chip 11. In the case where the support member is a lead frame, the electrically conductive leads extend out from and are integrally formed with a chip supporting section also forming part of the lead frame. In the case where the support member is a substrate, the leads 16 are printed on the same surface thereof that supports the IC chip. In either of these cases, the support member has heretofore typically been designed, more recently by means of CAD tools, such that its leads extend out from the die 11 in a symmetric pattern around the die, as illustrated in FIG. 1. As seen there, one group of leads extend horizontally to the left, another group horizontally to the right, a third group vertically upward and, finally, a fourth group vertically downward. In accordance with some prior art configurations, leads are provided in a more radial pattern so as to fill up the areas left blank in FIG. 1. In all of these cases, the various leads 16 are connected to respective output/input terminals 12 of die 11 by means of bonding wires 18 which, more or less, extend in line with their respective leads.

In manufacturing the overall plastic encapsulated integrated circuit package 10 which includes die 11, its support 14, leads 16 and bonding wires 18, these latter components are interconnected in the manner illustrated in FIG. 1 to form an overall unit. This unit is placed in a conventional closed mold which is generally indicated at 20 and which contains a gate or opening 22 for accommodating the flow of plastic material 23 under suitable pressure into the mold and over the die, bonding wires and end segments of the leads from an external source so as to encapsulate these latter components. In the particular arrangement illustrated in FIG. 1, it should be noted that the flow path of plastic material is diagonally from the upper lefthand corner at gate 22 toward the bottom righthand corner, as indicated by arrow 24. It should be apparent from FIG. 1 that all of the leads 16 extend in directions that define acute angles with flow path 24 that are equal to or greater than 45°. Indeed, in those radial patterns where leads extend diagonally from the upper righthand corner and the lower lefthand corner, as exemplified by dotted lines at 16', the approach angle $\theta$ between the flow path 24 and those leads is as much as 90°. In all of these cases, as the plastic flows into mold 20 through gate 22 in the direction of arrow 24, it sweeps across bonding wires 18 creating drag forces across these wires to a degree which depends upon approach angle $\theta$. As $\theta$ increases from 45° (in the case of most of the bonding wires 18) to 90° (in the case of the bonding wires associated with leads 16') the drag across those wires by the flowing plastic will also increase. This is best illustrated in FIG. 2 where a bonding wire is diagrammatically illustrated in three positions, namely 18a, 18b and 18c, with respect to the flow direction 24 of plastic material, as the latter enters mold 20. The bond wire shown in position 18a defines an approach angle $\theta$ 90° with the flow path of plastic, position 18b defines a lesser, acute approach angle $\theta$ and position 18c defines an approach angle of zero, that is, where the bonding wire is parallel to the direction of flow. It should be apparent from FIG. 2 that, in the case of position 18a, the drag force on the bonding wire is maximum, it decreases in position 18b and is negligible in position 18c. As will be seen hereinafter, applicants in recognizing this relationship between the approach angle of flowing plastic into mold 20 and the position of bonding wires 18, have designed an integrated circuit package in accordance with the present invention so as to minimize and preferably substantially entirely eliminate the resulting drag forces on the bonding wires.

As will be described in more detail hereinafter, there is disclosed herein an integrated circuit package and its method of manufacture, wherein the package is encapsulated by plastic which, during formation of the package, is caused to flow over the latter in a given flow direction. The package itself comprises an IC chip including an array of chip output/input terminals and a support member, for example a lead frame or a substrate, for supporting the IC chip and including an array of electrically conductive leads, all of which are provided for connection with the input/output terminals of the IC chip. In accordance with the present invention, the integrated circuit package also includes bonding wires connecting the chip output/input terminals with respective ones of the electrically conductive leads such that each bonding wire extends in a direction that defines an acute angle of less than 45° with the given flow direction of the plastic material. In a preferred embodiment, at least a portion of the bonding wires are substantially parallel with the given flow direction of plastic material and, in a most preferred embodiment, substantially all of the bonding wires are parallel or approximately parallel with the given flow direction.

Figure 3:
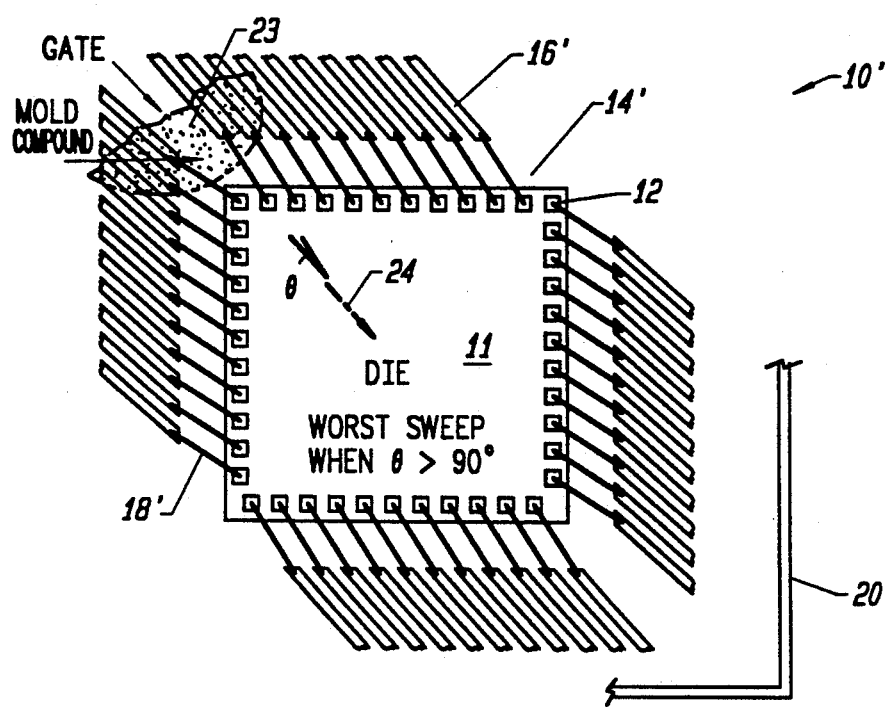
Figure 4:
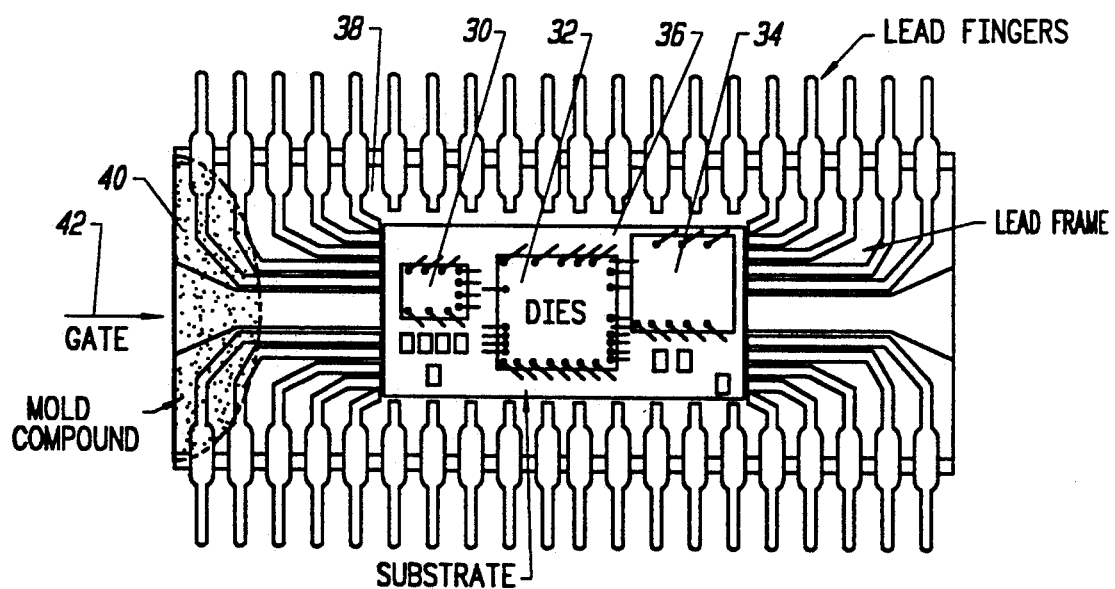

The present invention will be described in more detail hereinafter in conjunction with the drawings wherein:

FIG. 1 diagrammatically illustrates an intermediate step in the formation of a plastic encapsulated integrated circuit package manufactured in accordance with the prior art;

FIG. 2 diagrammatically illustrates how a bonding wire forming part of the package of FIG. 1 is subjected to drag forces caused by the flow of plastic encapsulating material during formation of the package of FIG. 1;

FIG. 3 diagrammatically illustrates an intermediate step in the formation of a plastic encapsulated integrated circuit package designed in accordance with the present invention to minimize drag forces on its bonding wires during formation of the package; and FIG. 4 diagrammatically illustrates an intermediate step in the formation of a plastic encapsulated integrated circuit package designed in accordance with a further embodiment of the present invention.

Having previously discussed FIGS. 1 and 2, attention is immediately directed to FIG. 3 which, as stated above, diagrammatically illustrates an intermediate step in the formation of a plastic encapsulated integrated circuit package designed in accordance with the present invention and generally indicated by the reference numeral 10'. Like package 10 depicted in FIG. 1, package 10' includes a die or IC chip 11 having an array of chip output/input terminals 12 and supported on a lead frame, substrate or other suitable support means 14' including an array of electrically conductive leads 16', all of which are provided for connection with the output/input terminals of die 11 by means of respective bonding wires 18'. Package 10' is shown in the same condition as package 10, that is, within mold 20 awaiting the receipt of plastic material 23 as the latter flows into the mold through gate 22 in the flow direction indicated by arrow 24.

In accordance with the present invention, each of the electrically conductive leads 16' extends in a direction that defines an approach angles $\theta$ of less than 45° with the given flow direction 24. Indeed, all of these leads are substantially parallel to flow direction 24, as indicated in FIG. 3. As a result, the various bonding wires 18' extend in substantially corresponding directions. Therefore, the drag on each and every one of these bonding wires due to the inflow of plastic material is minimized. Where support member 14' is a substrate and the leads 16' are printed on one surface thereof, it is relatively easy to provide the leads in the parallel relationship illustrated, regardless of the number of leads in question (within reason). On the other hand, where the support member is a lead frame, as a practical matter, it is difficult to provide the desired parallel relationship for high pin count lead frames, that is, lead frames of 60 leads or more. Therefore, in the case of lead frames, the configuration illustrated in FIG. 3 is most applicable to low pin count lead frames.

While the present invention has been described in conjunction with a single IC chip on a substrate or lead frame with all of its bonding wires extending substantially parallel with a flow direction 24 of plastic material, it is to be understood that the present invention is not limited to this particular arrangement. In the first place, the present invention contemplates an arrangement where all of the bonding wires are not necessarily parallel to the plastic flow direction but at least define acute angles of less than 45° therewith, in contrast to the prior art configuration illustrated in FIG. 1, thereby decreasing drag resistance across the bonding wires. At the same time, the present invention contemplates more than one die, as illustrated in FIG. 4. As seen there, three dies 30, 32 and 34 are shown supported on a substrate 36 which, in turn, is shown supported on a lead frame 38. This overall package is shown receiving a plastic encapsulating compound 40 flowing over the package in the flow direction 42. Note specifically that some of the bonding wires interconnecting the dies to cooperating leads on the substrate (not shown) extend in directions parallel to the flow direction 42 and the rest extend in directions that define acute angles less than 45° with the flow direction 42.

We claim:

1. An integrated circuit package encapsulated by plastic which during formation of the package was caused to flow over the latter in a given flow direction, said package comprising:
   (a) an IC chip including an array of chip output/input terminals;
   (b) means for supporting said chip, said support means including an array of electrically conductive leads, all of which are provided for connection with the output/input terminals of said IC chip, all of said leads extending in directions that define acute angles of less than 45° with said given flow direction;
   (c) bonding wires connecting said chip output/input terminals with respective ones of said leads such that each bonding wire extends in substantially the same direction as its connected lead, whereby all of said bonding wires define acute angles of less than 45° with said given flow direction; and
   (d) plastic material encapsulating said IC chip, support means and bonding wires.

2. An integrated circuit package according to claim 1 wherein at least a portion of said leads and connected bonding wires are substantially parallel with said given flow direction.

3. An integrated circuit package according to claim 2 wherein substantially all of said leads and connected bonding wires are substantially parallel with said given flow direction.

4. An integrated circuit package according to claim 1 wherein said supporting means includes a dielectric substrate having said electrically conductive leads printed on a surface thereof.

5. An integrated circuit package according to claim 1 wherein said supporting means includes a lead frame including a chip supporting section and said electrically conductive leads integrally formed with said chip supporting section.

6. An integrated circuit package according to claim 5 wherein said lead frame includes less than sixty of said integral leads.

7. An integrated circuit package encapsulated by plastic which during formation of the package was caused to flow over the latter in a given flow direction, said package comprising:
 (a) an IC chip including an array of chip output/input terminals;
 (b) means for supporting said chip, said support means including an array of electrically conductive leads, all of which are provided with the output/input terminals of said IC chip;
 (c) bonding wires connecting said chip output/input terminals with respective ones of said leads such that each bonding wire extends in a direction that defines an acute angle of less than 45° with said given flow direction; and
 (d) plastic material encapsulating said IC chip, support means and bonding wires.

8. An integrated circuit package according to claim 6 wherein at least a portion of said bonding wires are substantially parallel with said given flow direction.

9. An integrated circuit package according to claim 8 wherein substantially all of said bonding wires are substantially parallel with said given flow direction.

10. A dielectric substrate for supporting an IC chip having an array of output/input terminals within and forming part of an integrated circuit package encapsulated by plastic which, during formation of the package, was caused to flow over the latter in a given flow direction, said substrate comprising:
 (a) a main body having one surface thereof including a section for supporting said chip; and
 (b) an array of electrically conductive leads, all of which are provided for connection with the input/output terminals of IC chip, all of said leads extending in directions that define acute angles of less than 45° with said given flow direction.

11. A dielectric substrate according to claim 10 wherein at least a portion of said leads are substantially parallel with said given flow direction and therefore with one another.

12. A dielectric substrate according to claim 11 wherein substantially all of said leads are substantially parallel with said given flow direction and therefore with one another.

13. A lead frame for supporting an IC chip having an array of output/input terminals within and forming part of an integrated circuit package encapsulated by plastic which, during formation of the package, was caused to flow over the latter in a given flow direction, said lead frame comprising:
 (a) a main body having one surface thereof including a section for supporting said chip; and
 (b) an array of electrically conductive leads, all of which are provided for connection with the input/output terminals of IC chip, all of said leads integrally formed with and extending from said one surface of said main body in directions that define acute angles of less than 45° with said given flow direction.

14. A lead frame according to claim 13 wherein at least a portion of said leads are substantially parallel with said given flow direction and therefore with one another.

15. A lead frame according to claim 13 wherein substantially all of said leads are substantially parallel with said given flow direction and therefore with one another.

* * * * *